United States Patent
Bickley et al.

[11] Patent Number: 6,088,581
[45] Date of Patent: Jul. 11, 2000

[54] METHOD AND APPARATUS FOR REDUCING AMPLITUDE MODULATED INTERFERENCE IN A RECEIVER

[75] Inventors: Robert Henry Bickley, Paradise Valley; Michael Newton Pickett, Phoenix, both of Ariz.

[73] Assignee: Motorola, Inc., Schaumburg, Ill.

[21] Appl. No.: 09/049,220

[22] Filed: Mar. 27, 1998

[51] Int. Cl.[7] .................................................. H04B 1/26
[52] U.S. Cl. ...................... 455/131; 455/326; 455/232.1; 455/303; 455/304; 455/323; 455/324
[58] Field of Search ................................. 455/131, 324, 455/303, 304, 234.1, 232.1, 67.6, 323, 326, 302

[56] References Cited

U.S. PATENT DOCUMENTS

| | | | |
|---|---|---|---|
| 4,031,469 | 6/1977 | Johnson | 455/226.4 |
| 5,095,536 | 3/1992 | Loper | 455/324 |
| 5,101,509 | 3/1992 | Lai | 455/183.1 |
| 5,483,696 | 1/1996 | Wheatley, III et al. | 455/318 |
| 5,548,840 | 8/1996 | Heck | 455/326 |
| 5,555,451 | 9/1996 | Kennedy et al. | 455/61.2 |
| 5,579,347 | 11/1996 | Lindquist et al. | 375/346 |
| 5,608,331 | 3/1997 | Newberg et al. | 324/613 |
| 5,613,233 | 3/1997 | Vagher | 455/296 |
| 5,638,401 | 6/1997 | Jones | 375/298 |
| 5,678,219 | 10/1997 | Agarwal et al. | 455/280 |
| 5,701,600 | 12/1997 | Wetters et al. | 455/208 |
| 5,740,520 | 4/1998 | Cyze et al. | 455/69 |
| 5,822,687 | 10/1998 | Bickley et al. | 455/226.1 |
| 5,826,182 | 10/1998 | Gilbert | 455/326 |
| 5,862,466 | 1/1999 | Erickson | 455/321 |
| 5,881,376 | 3/1999 | Lundberg et al. | 455/226.1 |
| 5,953,643 | 9/1999 | Speake et al. | 455/324 |
| 5,963,600 | 10/1999 | Rausch et al. | 375/344 |

Primary Examiner—Dwayne D. Bost
Assistant Examiner—Temica M. Davis
Attorney, Agent, or Firm—John C. Scott; Frank J. Bogacz

[57] ABSTRACT

A direct conversion receiver (DCR)(10) comprises amplitude modulated interference (AMI) nulling circuitry (32) for achieving enhanced cancellation of AMI. The AMI nulling circuitry (32) includes a first signal processor (42) and a second signal processor (44) for processing first and second differential output signals, respectively, from a mixer (24*a*). The first signal processor (42) includes an adjustable transfer function that is controlled by a controller (50). The controller (50) adjusts the transfer function of the first signal processor (42) to equalize the magnitudes of AMI components in the first and second differential output signals. The first and second differential output signals are then combined in a manner which cancels the equalized AMI components.

23 Claims, 5 Drawing Sheets

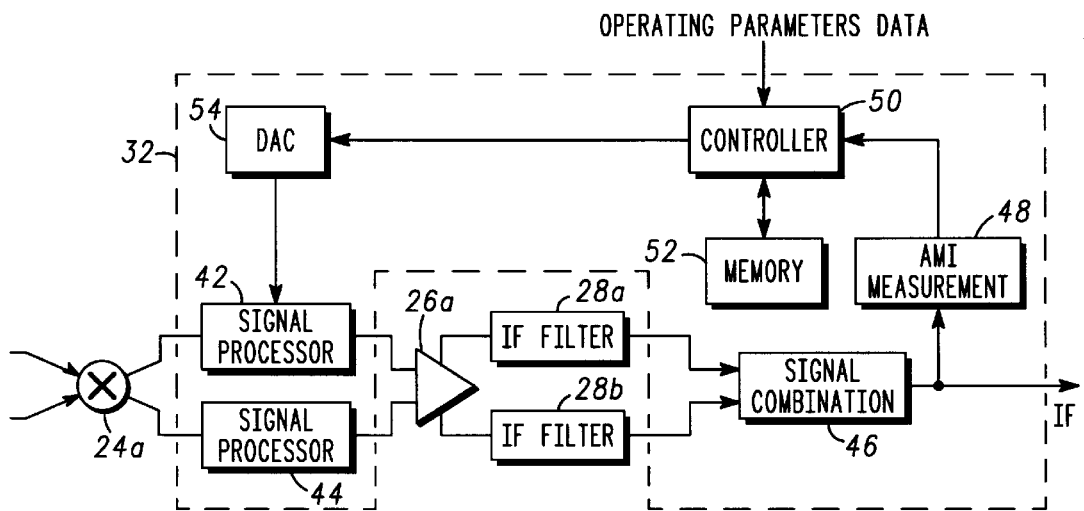
FIG. 2
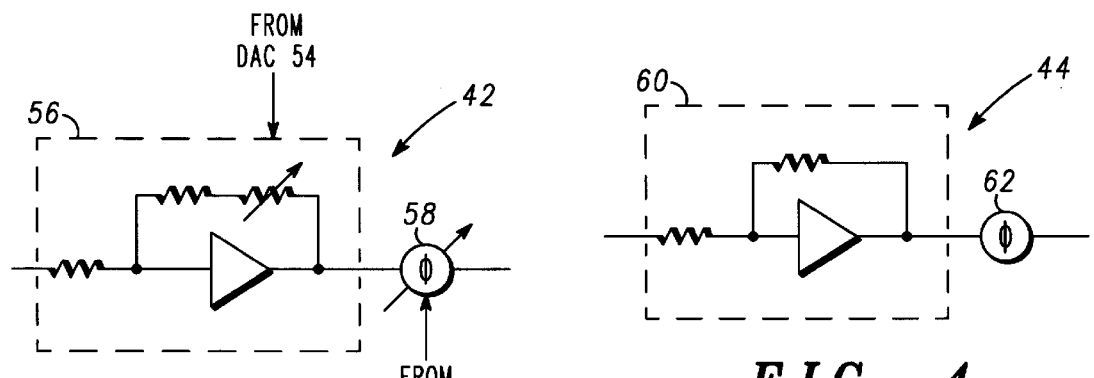
FIG. 3
FIG. 4
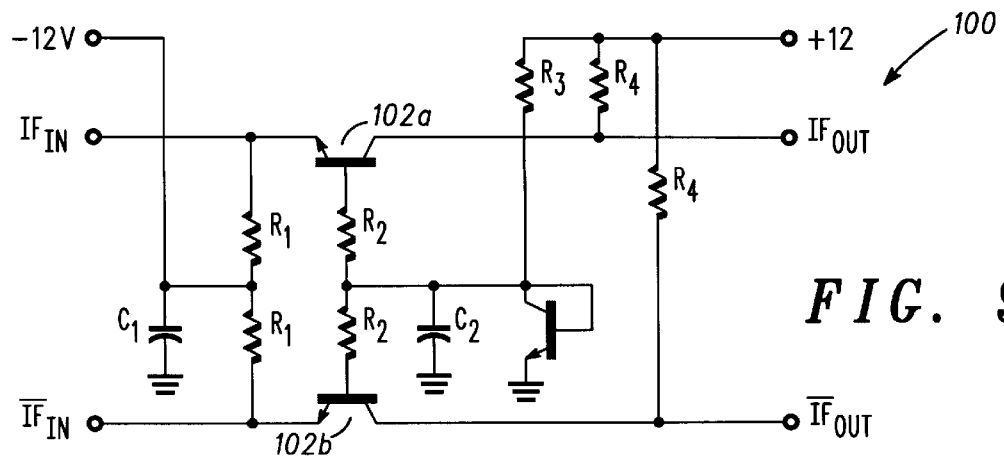
FIG. 9

METHOD AND APPARATUS FOR REDUCING AMPLITUDE MODULATED INTERFERENCE IN A RECEIVER

FIELD OF THE INVENTION

The invention relates in general to radio frequency receivers and, more particularly, to direct conversion receivers.

BACKGROUND OF THE INVENTION

The superheterodyne receiver is a receiving system that performs a frequency conversion on a received signal as part of the detection process. That is, the received signal is converted from a first frequency range (i.e., the RF frequency) to a different, second frequency range (i.e., the intermediate or IF frequency) in a frequency conversion device, such as a mixer. The IF frequency can be greater than the RF frequency, in which case the receiver is known as an up-converter system, or the IF frequency can be lower than the RF frequency, in which case the receiver is known as a down-converter system.

The direct conversion receiver (DCR) is a special case of the superheterodyne receiver where the IF signal is located at substantially zero frequency (i.e., direct current or DC). To implement a direct conversion receiver, a local oscillator frequency that is substantially equal to the desired RF frequency is applied to the first mixer stage. Direct conversion receivers are generally attractive for many reasons, including extremely wide frequency range, simplicity, and monolithic integration of a majority of the circuits (such as, for example, the IF gain and filter selectivity circuits). However, direct conversion receivers suffer from a problem that is avoided in conventional superheterodyne receivers that do not convert to DC. That is, strong amplitude varying signals (such as pulsed or amplitude modulated carriers) in the vicinity of the receiver and at frequencies within or near the RF preselector pass-band can be detected in the nonlinear elements of the mixer (by the square law process). These interfering signals can show up at the output of the mixer as low frequency signals around DC. In a conventional superheterodyne receiver, these interfering signals (which will be referred to herein as amplitude modulated interference or AMI) are rejected in the IF band-pass filter, which is tuned to pass only a range of frequencies centered on the IF frequency (which is much higher than the frequency of the detected AMI baseband signal). In a DCR, however, the IF filter is a low-pass filter that often passes the AMI to an output. The presence of this AMI in the IF output signal can seriously degrade the performance of the DCR.

Therefore, there is a need for a method and apparatus for reducing the impact of AMI in a direct conversion receiver.

BRIEF DESCRIPTION OF THE DRAWING

FIG. 2 is a block diagram illustrating AMI nulling circuitry in accordance with one embodiment of the present invention;

FIG. 3 is a schematic diagram illustrating a signal processor having an adjustable transfer function in accordance with one embodiment of the present invention;

FIG. 4 is a schematic diagram illustrating a signal processor having a fixed transfer function in accordance with one embodiment of the present invention;

FIG. 9 is a schematic diagram illustrating a buffer amplifier in accordance with one embodiment of the present invention.

DETAILED DESCRIPTION OF THE DRAWINGS

The present invention relates to a direct conversion receiver (DCR) that is capable of reducing the impact of amplitude modulated interference (AMI) in the vicinity of the receiver. The DCR uses a mixer that outputs two differentially related signals at an IF output port. When AMI is present at the input of the DCR, the two differentially related output signals from the mixer each include an AMI component having similar amplitude and polarity. The two differentially related output signals are processed in separate signal processors, at least one of which includes an adjustable transfer function. During DCR operation, the adjustable transfer function of one or more of the signal processors is adjusted to equalize the amplitudes of the two AMI components so that better cancellation of AMI can be achieved. In one embodiment, a transfer function adjustment value that is known to provide optimal cancellation of AMI in the DCR is delivered to one or more of the signal processors. The transfer function adjustment value is chosen based on the current operating parameters of the DCR. In addition, a memory can be provided for storing a plurality of transfer function adjustment values corresponding to an array of operating parameter values.

One of the advantages of the present invention is that it allows a DCR to achieve AMI cancellation similar to that of a conventional superheterodyne receiver using a non-zero IF frequency, without the associated cost and complexity of the conventional superheterodyne receiver. This allows a less expensive DCR to be used in a severe RF environment where only a conventional superheterodyne receiver could previously be reliably used. The invention is capable of achieving an AMI rejection improvement of from 40–60 dB over previously known methods. In addition, the present invention is effective over very wide bandwidths whereas prior methods, such as receivers having balanced/symmetrical circuit designs, typically degrade over wide bandwidths.

Figure 1:
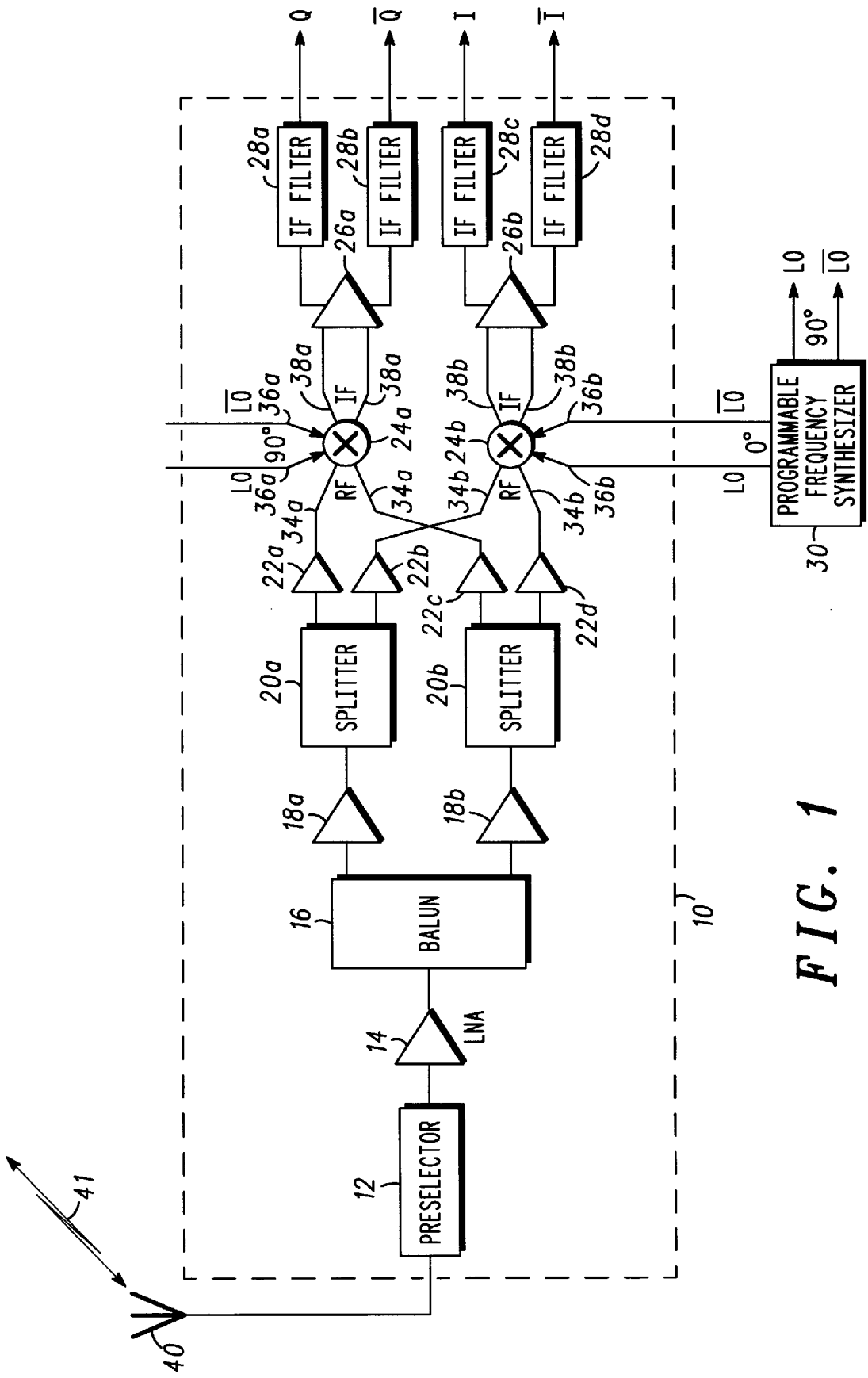
FIG. 1 is a block diagram illustrating a direct conversion receiver (DCR) that can utilize the techniques of the present invention.

FIG. 1 is a block diagram of a direct conversion receiver (DCR) 10 that can utilize the principles of the present invention. The DCR 10 includes: a preselector 12; a low noise amplifier (LNA) 14; a balun 16; two preamplifiers 18a, 18b; two equiphase splitters 20a, 20b; four RF amplifiers 22a–22d; two mixers 24a, 24b; two buffer amplifiers 26a, 26b; and four IF filters 28a, 28b, 28c, and 28d. An antenna 40, or other signal reception device, receives a signal from a communications channel 41. The signal is delivered to the preselector 12 which band-pass filters the signal to remove unwanted signal components (e.g., interference). The filtered receive signal is then input into the LNA 14 which provides low noise gain to the signal. The signal is next delivered to the balun 16 which converts the signal from a single-ended signal to a balanced signal having two differential signal components. That is, the two signal components have substantially equal magnitudes but are opposite in polarity from one another. The two differential signal components are amplified in the preamplifiers 18a, 18b and are then each split into two further components in the two equiphase splitters 20a, 20b. Each equiphase splitter 20a, 20b divides its respective input signal into two signals of substantially equal magnitude and phase. The outputs of the two equiphase splitters 20a, 20b are then amplified in the RF amplifiers 22a–22d and delivered to the mixers 24a, 24b.

The mixers 24a, 24b are operative for performing a frequency conversion on the signals output by the RF amplifiers 22a–22d. In the preferred embodiment, each mixer 24a, 24b is doubly balanced and includes a balanced RF input port 34a, 34b, a balanced LO input port 36a, 36b, and a balanced IF output port 38a, 38b. Two mixers are used to perform the frequency conversion, rather than one, to facilitate the creation of both in-phase (I) and quadrature (Q) signals at an output of the receiver. These I and Q signals are generally sent to a demodulator for use in detecting received information.

Each mixer 24a, 24b receives a balanced RF input signal (comprising two differential RF signal components) at its balanced RF input port 34a, 34b. For example, mixer 24a receives a first differential RF signal component from RF amplifier 22a (which derives from a first of the balun outputs) and a second differential RF signal component from RF amplifier 22c (which derives from a second of the balun outputs). Each of the mixers 24a, 24b also receives a balanced LO input signal (comprising two differential LO signal components) from a programmable frequency synthesizer 30. To obtain I and Q outputs from the mixers 24a, 24b, as described above, the LO input signals delivered to the two mixers 24a, 24b are 90 degrees out of phase with one another (i.e., they are in quadrature with one another).

The balanced IF output signals of the mixers 24a, 24b are each delivered to a respective buffer amplifier 26a, 26b for amplification. After the signals have been amplified, each of the four differential IF signal components in the two balanced signals is individually filtered in one of four IF filters 28a–28d. The IF filters 28a–28d are each low-pass filters that are designed to reject unwanted frequency components in the IF signal. Low-pass filters are used because, as discussed above, the mixers in a DCR convert down to zero frequency (i.e., DC). The differential outputs from the first pair of IF filters 28a, 28b represent the IF quadrature (Q) outputs of the DCR 10 while the differential outputs from the second pair of IF filters 28c, 28d represent the IF in-phase (I) outputs of the DCR 10. Because direct conversion is being performed, the LO frequency will be substantially the same as the RF (received signal) frequency.

As described above, desired RF signals received at the input of the DCR 10 appear as differential signals at the balanced IF output ports 38a, 38b of the mixers 24a, 24b. AMI present at the input of the DCR 10, on the other hand, appears as two approximately equal signals at the balanced IF output ports 38a, 38b of the mixers 24a, 24b. That is, common-mode AMI interference components are present on the balanced IF output port of each mixer 24a, 24b. The reason the AMI components are common-mode, rather than differential, is because the AMI components are the result of square law detection in the mixers 24a, 24b and are not the product of the differential LO signal.

The common-mode AMI components can be at a frequency that is within the pass-band of the IF filters 28a–28d, in which case they appear in the IF output signals of the IF filters 28a–28d. A substantial portion of these common-mode AMI components can be canceled by combining the two differential output signals from each pair of IF filters into a single-ended signal using, for example, a differential amplifier. If the AMI signal components in each of the two differential output signals were exactly the same, the combination of the signals would perfectly cancel the AMI components and a clean output signal would be sent to the detector. However, because each individual path through the DCR 10 presents a slightly different gain and phase response to a propagating signal, the AMI components on the two balanced lines are rarely equal, and perfect cancellation is not achieved. In accordance with the present invention, means are provided for achieving balanced AMI components on the IF output lines, thereby producing a much higher level of AMI cancellation.

FIG. 2 is a block diagram illustrating AMI nulling circuitry 32 in accordance with one embodiment of the present invention. For convenience, the AMI nulling circuitry 32 is only illustrated for the first mixer 24a. However, it should be appreciated that each mixer in a multi-mixer design will require similar circuitry. The AMI nulling circuitry 32 includes a first signal processor 42, a second signal processor 44, a signal combination unit 46, an AMI measurement unit 48, a controller 50, a memory 52, and a digital-to-analog converter (DAC) 54. The first and second signal processors 42, 44 are each operative for processing one of the two differential IF output signals according to a predetermined transfer function. The transfer function of the first signal processor 42 is adjustable with respect to the second signal processor 44 and, therefore, can be adjusted to equalize the AMI components. The signal combination unit 46 combines the differential IF signal from the IF filters 28a, 28b in a manner that cancels the common mode AMI component. As such, the signal combination unit 46 can include a difference amplifier or other device capable of achieving a difference between two signals. In one embodiment, signal combination is performed in the signal demodulator. The AMI measurement unit 48 is operative for measuring the magnitude of the AMI signal after cancellation. This function is performed during a calibration procedure which will be described in greater detail shortly.

In general, the first and second signal processors 42, 44 can be located anywhere between the output of the mixer 24a and the input of the signal combination unit 46, in accordance with the present invention. However, it has been determined that locating the first and second signal processors 42, 44 before the baseband circuits (i.e., the buffer amplifier 26a and the IF filters 28a, 28b) achieves optimal results. This approach avoids degrading the common mode rejection in the baseband chain and minimizes distortion caused by the variable gain element (due to the lower signal level at this point in the receiver).

The controller 50 is used to, among other things, control the adjustment of the transfer function of the first signal processor 42 to equalize the AMI components. The controller 50 can include, for example, a microprocessor or digital signal processor (DSP). In a preferred embodiment of the present invention, the controller 50 adjusts the transfer function of the first signal processor 42 based on the current operating parameters of the receiver. In this embodiment, the memory 52 stores a plurality of transfer function adjustment values corresponding to a plurality of different operating parameter value combinations (or, if only a single operating parameter is being used, to a plurality of values for the single parameter). During operation, the controller 50 determines a present value for each of the receiver operating parameters being used. The controller 50 then retrieves a digital transfer function adjustment value from the memory 52 that corresponds to the parameter value(s) determined. The digital transfer function adjustment value is delivered to the DAC 54 for conversion to an analog value which is then delivered to the first signal processor 42 to adjust the transfer function thereof accordingly. After the transfer function of the first signal processor 42 has been adjusted, the AMI will be canceled in an optimal fashion in the signal combination unit 46. In one embodiment of the present invention, the transfer function adjustment value delivered to the first signal processor 42 is updated anytime there is a significant change in any one of the relevant parameter values. In another embodiment, the adjustment value is updated periodically, or continuously, whether a parameter value change has been detected or not.

The operating parameters relied upon by the controller 50 can include any receiver operating parameter that effects the balance of the AMI signal output by the mixer. For example, parameters such as current operating frequency (as indicated by the current LO frequency), current receiver temperature, and IF filter bandwidth setting can be used.

With reference to FIG. 3, in one embodiment of the present invention, the first signal processor 42 includes a variable gain amplifier 56 and a variable phase shifter 58. The variable gain amplifier 56 is operative for varying an amount of gain applied to an IF signal flowing into its input port. The variable gain amplifier 56 allows the controller 50 to compensate for gain variations between the two signal flow paths through the DCR 10 that result in the differential signals emerging from the mixer 24a. The variable phase shifter 58 is operative for adjusting the insertion phase of the first signal processor 42 and can thus be used to compensate for any phase variations between paths in the DCR 10. It has been found, however, that phase shift is not as important as variable gain for producing optimal AMI cancellation. It should be appreciated that virtually any device that is capable of changing the phase and/or gain characteristic of a signal flow path in a predictable, distortion-free manner can be used in the first signal processor 42. It should also be appreciated that any number of variable devices can be used in the first signal processor 42, with each device requiring a separate adjustment value from the controller 50. The adjustment ranges of the variable devices should be on the order of the flow path differences that are possible. In practice, these differences are generally relatively small and, therefore, only a small amount of variability is normally required.

In a preferred embodiment of the present invention, the second signal processor 44 will be substantially the same configuration as the first signal processor 42, without the variability. For example, with reference to FIG. 4, the second signal processor 44 can include a fixed gain amplifier 60 and a fixed delay phase shifter 62. The gain of the fixed gain amplifier 60 will preferably be equal to a nominal gain of the variable gain amplifier 56 of the first signal processor 42, so that the gain of the variable gain amplifier 56 can be varied an adequate amount above and below the nominal value. Likewise, the phase shift of the fixed delay phase shifter 62 will preferably be equal to a nominal phase shift of the variable phase shifter 58.

In an alternative embodiment, the second signal processor 44 is simply a through line. That is, the second signal processor 44 does not significantly change the signal propagating along the second differential IF output line. In this case, the first signal processor 42 should be capable of variation both above and below the characteristics of the basic through line. For example, a through line generally has approximately 0 dB of gain/attenuation. Therefore, to provide compensation for signal path variations, the first signal processor 42 should be able to provide both positive and negative gain to a propagating signal. This can be achieved by providing both a variable gain amplifier and a variable attenuator in the first signal processor 42. To provide for phase variation, the electrical length of the through line is made equal to a nominal electrical length of the first signal processor 42 (i.e., the electrical length of the first signal processor 42 when the variable phase shifter 58 is set at an intermediate phase position between phase extremes). This allows the electrical length of the first signal processor 42 to be adjusted both above and below the electrical length of the second signal processor 44.

In yet another embodiment of the present invention, both the first signal processor 42 and the second signal processor 44 include a variable transfer function. The variability of the transfer function of the second signal processor 44, however, must be at least partially independent of the variability of the transfer function of the first signal processor 42. In such a system, the controller 50 will deliver transfer function adjustment values to both the first and the second signal processors 42, 44 to obtain optimal AMI cancellation. For example, the first and second signal processors 42, 44 can each include a separately controlled variable attenuator. If the signal flow path leading to the first signal processor 42 is a higher gain flow path than that leading to the second signal processor 44 for a particular set of receiver operating parameter values, then more attenuation is applied in the first signal processor 42 than in the second signal processor 44. Conversely, if the signal flow path leading to the second signal processor 44 is a higher gain flow path than that leading to the first signal processor 42 for the set of receiver operating parameter values, then more attenuation is applied in the second signal processor 44 than in the first signal processor 42.

Figure 5:
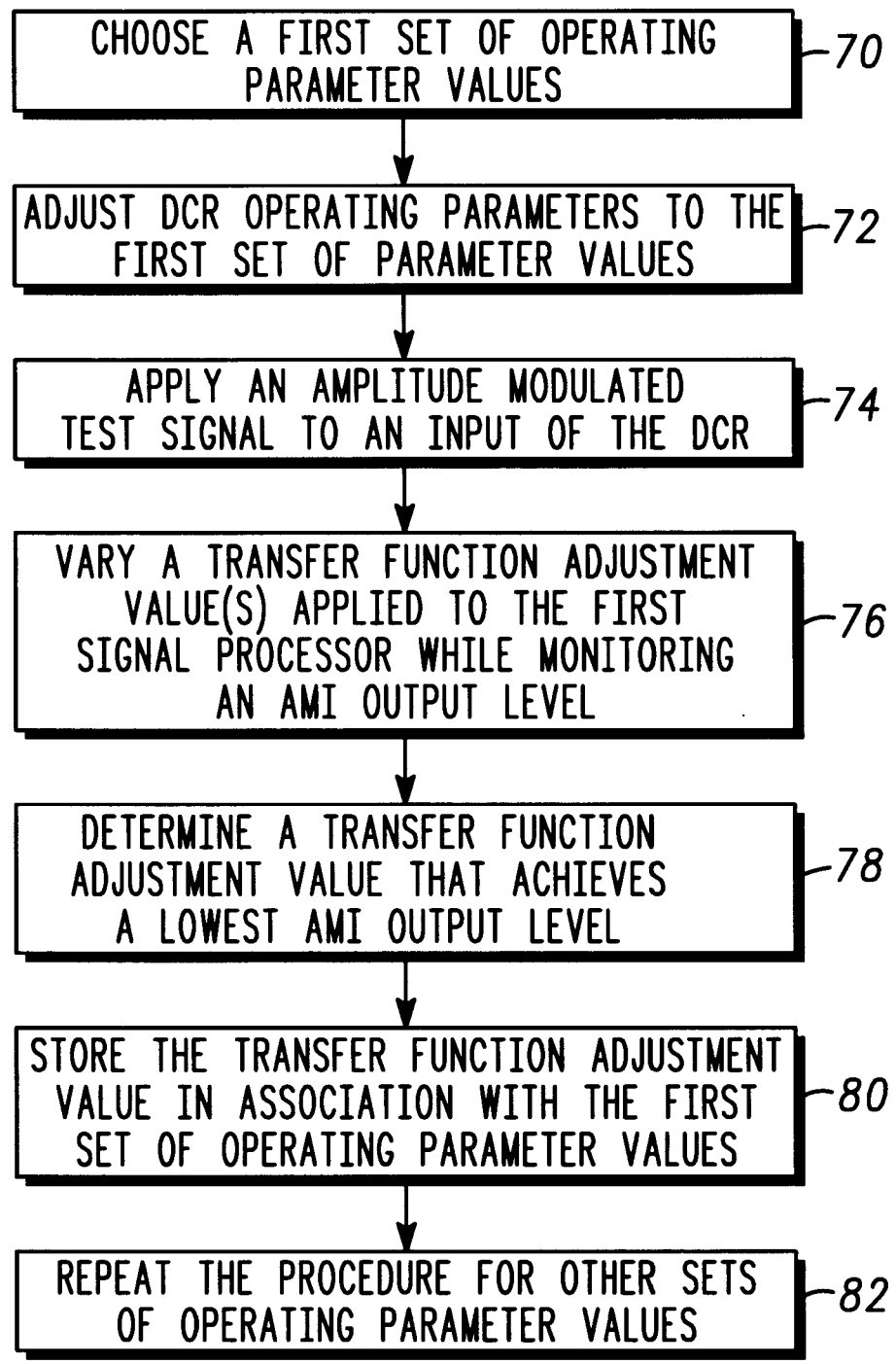
FIG. 5 is a flowchart illustrating a method for performing a receiver calibration in accordance with one embodiment of the present invention.

The transfer function adjustment values stored in the memory 52 are developed during a calibration procedure. The calibration procedure can be performed during receiver manufacture and/or it can be performed periodically during receiver operation. FIG. 5 is a flowchart illustrating a method for performing a receiver calibration in one embodiment of the present invention. First, an initial set of operating parameter values is chosen (step 70). The set can include one or more values. In one embodiment of the invention, for example, a particular tuned frequency range (i.e., a particular LO frequency) is chosen. The operating parameters of the system are then adjusted to reflect the first set of parameter values (step 72). For example, an LO signal having the chosen frequency can be delivered to each mixer in the system. Next, an AM modulated test signal is generated and applied to an input of the receiver (step 74). With all operating parameters set, a transfer function adjustment value delivered to the first signal processor 42 is varied while monitoring the AMI output level of the receiver (step 76). If multiple transfer function adjustment values are being delivered to the first signal processor 42 (e.g., one to control an amplifier gain and one to control a phase value), only one will be varied at a time. Monitoring of the AMI output level can be performed by the AMI measurement circuitry 48 illustrated in FIG. 2. In a preferred embodiment, the AMI output level is monitored at a point in the receiver after the signal demodulator (not shown). This allows all potential errors to be accounted for in the calibration.

A transfer function adjustment value is next found that produces a lowest AMI output value (i.e., maximal cancellation)(step 78). That transfer function adjustment value is then stored in the memory 52 in a manner that can be indexed using the first set of operating parameter values (step 80). That is, the adjustment value can be retrieved using an address that is associated with the first set of operating parameter values. For example, if the set of operating parameter values includes only an LO frequency value, the transfer function adjustment value is stored at an address that is associated with the LO frequency value. This may require the use of a lookup table having a list of possible LO frequencies and associated memory storage locations.

The above-described procedure is then repeated for other sets of operating parameter values (step 82). In general, one parameter value will be changed for each successive iteration through the flowchart of FIG. 5 until all required parameter value sets have been calibrated. The result is a table of transfer function adjustment values that can be accessed during system operation. For example, if a single parameter is being used, a one dimensional table is generated having transfer function adjustment values for each of a plurality of values of the parameter (e.g., a plurality of LO frequencies). If two parameters are being used (for example, frequency and temperature), a two-dimensional matrix of transfer function adjustment values (TFAVs) will result, as shown in Table 1.

TABLE 1

|  | $temp_1$ | $temp_2$ | ... | $temp_m$ |
|---|---|---|---|---|
| $frequency_1$ | TFAV(1,1) | TFAV(1,2) | ... | TFAV(1,M) |
| $frequency_2$ | TFAV(2,1) | TFAV(2,2) | ... | TFAV(2,M) |
| . | | | | |
| . | | | | |
| . | | | | |
| $frequency_N$ | TFAV(N,1) | TFAV(N,2) | ... | TFAV(N,M) |

Each additional parameter will add one dimension to the table. The parameter values used are chosen so that an entire possible range for each operating parameter is tested.

Because a finite number of operating parameter values are actually tested, interpolation between transfer function adjustment values may be needed during operation to generate the appropriate value(s) for transfer to the first signal processor 42. In one embodiment of the invention, an algorithm in the controller 50 uses the current operating parameter values and the most nearly corresponding transfer function adjustment values stored in the memory 52 to generate the appropriate transfer function adjustment value for delivery to the first signal processor 42 using interpolation. In another embodiment, equations are used by the controller 50 to automatically generate the correct transfer function adjustment value for delivery to the first signal processor 42 upon input of the current operating parameter values, without having to access the memory 52. These equations are generated during manufacture using the values found during the above-described calibration procedure, via curve fitting or similar procedures. In yet another embodiment, a very large number of transfer function adjustment values (corresponding to very small parameter value increments) are generated using the measured transfer function adjustment values, and the large number of values are stored in the memory 52. During receiver operation, a stored transfer function adjustment value is used that corresponds most closely with the present operating parameter values.

Figure 6:
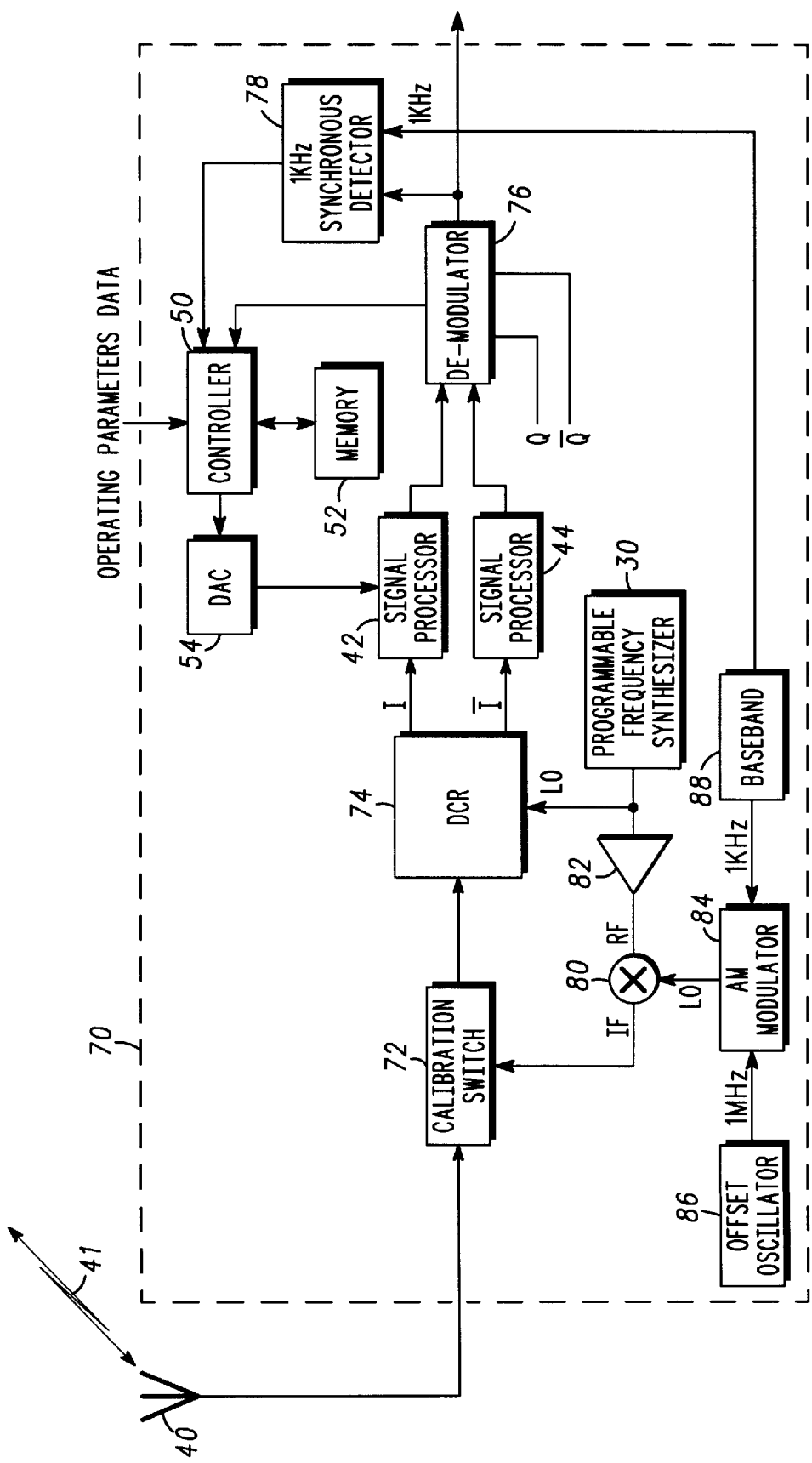
FIG. 6 is a block diagram illustrating a receiver system in accordance with one embodiment of the present invention that is capable of performing periodic self-calibration.

FIG. 6 illustrates a receiver system 70 that is capable of periodic self-calibration. Where possible, the same reference numerals are used in FIG. 6 that were used to describe similar elements in FIG. 2. The receiver system 70 includes: a calibration switch 72, a DCR 74, first and second signal processors 42, 44, a de-modulator 76, a 1 kHz synchronous detector 78, a controller 50, a memory 52, a DAC 54, a programmable frequency synthesizer 30, a mixer 80, an amplifier 82, an AM modulator 84, an offset oscillator 86, and a baseband signal generator 88. Although FIG. 6 only shows a single pair of signal processors 42, 44, corresponding to, for example, an in-phase (i.e., I) channel in the DCR 74, it should be appreciated that one or more other signal processor pairs may also be needed for other channels such as, for example, a quadrature (i.e., Q) channel. The calibration switch 72 can be switched between a first position, where the output of the antenna 40 is connected to the input of the DCR 74, and a second position, where the IF output of the mixer 80 is connected to the input of the DCR 10. When a self-calibration is initiated by the controller 50, the position of the calibration switch 72 is changed from the first position to the second position so that an AM modulated test signal can be applied to the DCR 74.

To create the AM modulated test signal, the AM modulator 84 modulates an RF signal from the offset oscillator 86 with a baseband signal from the baseband signal generator 88. The output frequency of the baseband signal generator 88 preferably falls within the passband of the IF filters in the DCR 74. In the illustrated embodiment, the frequency of the baseband signal is 1 kHz. The output frequency of the offset oscillator 86, on the other hand, is chosen to develop modulated test sidebands that are well outside the baseband IF filter bandwidth. This is done to ensure that only the 1 kHz AMI components will be output by the DCR 74 during calibration. The AM modulated signal is then up-converted in the mixer 80 using an amplified LO signal generated by the programmable frequency synthesizer 30 and the amplifier 82. The up-converted signal is then transferred to the input of the DCR 74.

The AM modulated test signal is processed in the DCR 74 which outputs an IF signal having two differential components (e.g., I and I' or Q and Q', where ' indicates the complementary signal). The first and second signal processors 42, 44 each receive one of the differential components and processes it according to a respective transfer function. It should be appreciated that, as discussed above, the first and second signal processors 42, 44 are ideally located before the baseband circuitry in the DCR 74. However, to simplify illustration, they are located outside the DCR 74 in FIG. 6. The outputs of the first and second signal processors 42, 44 are input into a de-modulator 76 that combines and de-modulates the signals. As discussed above, the same adjustment is made to the in-phase (i.e., I) channel. The demodulated output signal is then input into the 1 kHz synchronous detector 78 where its level is detected. The 1 kHz synchronous detector 78 receives a 1 kHz signal from the baseband signal generator 88 for synchronization purposes. Use of the 1 kHz synchronous detector 78 will, in general, improve the null sensitivity of the receiver system 70. The output of the 1 kHz synchronous detector 78 is delivered to the controller 50 for use in sensing the null for calibration.

As discussed above, calibration is performed by varying the transfer function adjustment value delivered to the first signal processor 42 while monitoring the AMI output level of the system. An adjustment value is then selected that minimizes the AMI level. The value is then stored in association with present operating parameter values, such as present LO frequency. The LO frequency (or other parameter) can then be changed and a next transfer function adjustment value found. This is repeated until transfer function adjustment values are found for an entire range of LO frequency values.

Self-calibrations can be performed whenever it is felt that the transfer function adjustment values stored in the memory 52 require an update. In general, it is desirable to perform self-calibrations during periods that will not interfere with system operation. For example, in a communications system that operates in a half-duplex mode (i.e., the system does not receive during transmit), such as a VHF air traffic control system, updates can be performed during each transmit mode. Also, in a communications system that uses time division multiple access (TDMA), updates can be performed during non-receive times. Further, in a communications system that uses frequency hopping spread spectrum techniques, updates can be performed during the period between hops.

Figure 7:
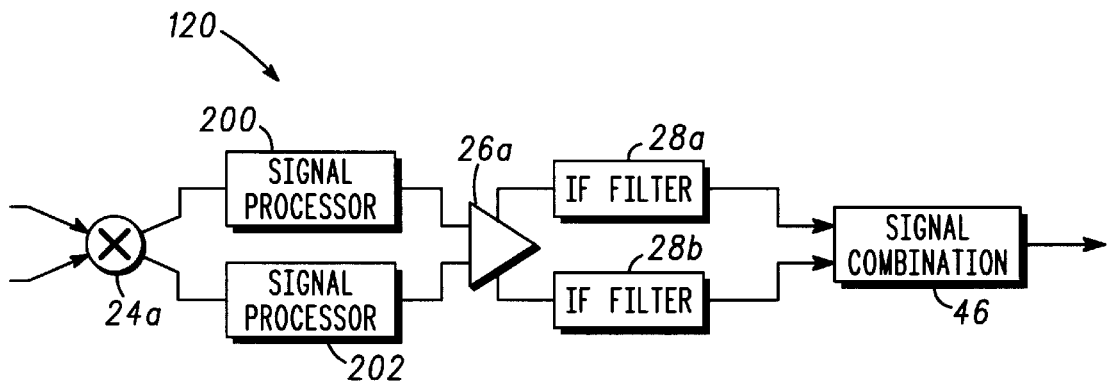
FIG. 7 is a block diagram of a portion of a DCR in accordance with one embodiment of the present invention.

FIG. 7 is a block diagram illustrating a portion 120 of a DCR in accordance with another embodiment of the present invention. The DCR portion 120 can be, for example, a part of DCR 10 of FIG. 1. Where possible, the same reference numerals are used in FIG. 7 that were used in FIG. 2 to describe similar functionality. As before, two signal processors (i.e., third signal processor 200 and fourth signal processor 202) receive the differential output signals from the mixer 24a and process them according to predetermined transfer functions. The resulting signals are amplified in the amplifier 26a, filtered in the IF filters 28a, 28b, and are combined in the signal combination unit 46. However, no functionality is provided for adjusting the transfer function of either of the signal processors 200, 202 during receiver operation in the field. Instead, the transfer function of the third signal processor 200 is adjusted in a calibration procedure during manufacture, after which it is left in a particular tuned state for eventual use in the field. Predetermined temperature compensation can be incorporated into the design to account for the general trend of the cicuitry over temperature. The DCR portion 120 of FIG. 7 has application in receiver systems that have little variation in system operating parameters in the field, such as in narrow-band communications systems.

Figure 8:
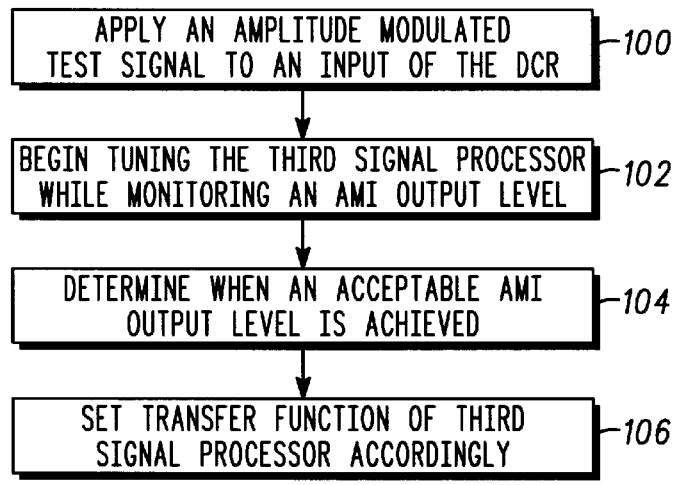
FIG. 8 is a flowchart illustrating a calibration procedure that can be used to calibrate the DCR portion of FIG. 7 in accordance with one embodiment of the present invention.

FIG. 8 is a flowchart illustrating a DCR calibration procedure for use with the DCR portion of FIG. 7. First, an amplitude modulated test signal is applied to the input of a DCR (step 100). The amplitude modulated test signal is similar to the signals described earlier. Next, the transfer function of the third signal processor 200 is tuned while the AMI output of the DCR is monitored (step 102). This tuning can take a wide variety of different forms. For example, in one embodiment, an amplifier on a semiconductor chip is physically trimmed to change the gain of the amplifier. In another embodiment, an adjustment value delivered to the third signal processor 200 is changed, as described above. While the third signal processor is being tuned, it is determined when an acceptable AMI output level has been achieved (step 104). The acceptable AMI output level can be, for example, a predetermined threshold level or a level at which an approximate AMI minimum is achieved. After the acceptable level has been achieved, the third signal processor 200 is configured to maintain the corresponding transfer function (step 106). For example, physical trimming can be stopped when a AMI threshold is transitioned. Consequently, no further adjustments are made during regular DCR operation.

FIG. 9 is a schematic diagram of a buffer amplifier circuit 100 that is used in one embodiment of the present invention. As illustrated, the buffer amplifier circuit 100 uses bipolar junction transistors (BJTs) 102a,b in a common base configuration to provide buffering for a corresponding mixer (not shown). Past buffer amplifier designs use an operational amplifier (op amp) to provide mixer buffering. Op amp designs require feedback to achieve low input impedance and are generally difficult to stabilize. In addition, op amps with very low noise figures are required for the buffer amplifier. These requirements make the op amp design difficult and expensive. The common base arrangement was found to provide low input impedance, wide bandwidth, and low noise figure without the use of feedback. The common base arrangement provides a broad band, low impedance termination for the mixer in the operating frequency band. As a result, the AMI null does not vary as much at different frequency offsets of the interfering signal. The buffer amplifier of the present invention is a simple low cost solution for providing wide bandwidth, low noise figure, low mixer terminating impedance, good stability, and good AMI performance. In an alternative embodiment, a field effect transistor (FET) in a common gate configuration is used in the buffer amplifier.

What is claimed is:

1. A receiver for processing a received amplitude modulated interference signal in a communications system, comprising:

a mixer for performing a frequency conversion on the received signal, said mixer having a first port for inputting the received signal, a second port for inputting a local oscillator signal, and a third port for outputting an intermediate frequency (IF) signal, wherein said IF signal includes first and second differential signal components;

a first signal processor for processing said first differential signal component according to a first transfer function;

a second signal processor for processing said second differential signal component according to a second transfer function, wherein said first transfer function is adjustable with respect to said second transfer function;

a signal combination unit for combining said first differential signal component and said second differential signal component, after processing in said first and second signal processors, in a manner that suppresses a common mode signal component;

said signal combination unit includes a difference amplifier to minimize distortion of said first and second transfer functions; and a buffer amplifier located between said mixer and said signal combination unit, said buffer amplifier including a bipolar junction transistor in a common base configuration.

2. The receiver, as claimed in claim 1, wherein:
said first signal processor includes variable gain means.

3. The receiver, as claimed in claim 1, wherein:
said first signal processor includes variable phase means.

4. The receiver, as claimed in claim 1, further comprising:
a controller for adjusting said first transfer function.

5. The receiver, as claimed in claim 4, wherein:
said controller adjusts said first transfer function based on current receiver operating parameters.

6. The receiver, as claimed in claim 4, wherein:
said current receiver operating parameters include one or more of the following: current operating frequency, current receiver temperature, and current IF filter bandwidth.

7. The receiver, as claimed in claim 4, further comprising:
a memory, coupled to said controller, for storing transfer function adjustment values for delivery to said first signal processor.

8. The receiver, as claimed in claim 7, wherein:
each of said transfer function adjustment values is associated with a particular combination of operating parameter values.

9. The receiver, as claimed in claim 7, wherein:
said controller includes means for interpolating between transfer function adjustment values based on current operating parameter values.

10. The receiver, as claimed in claim 7, further comprising:
self-calibration means for determining transfer function adjustment values for storage in said memory.

11. The receiver, as claimed in claim 10, wherein:
said self-calibration means includes a test signal generator for generating an amplitude modulated (AM) test signal for input into said receiver.

12. The receiver, as claimed in claim 11, wherein:
said AM test signal has a carrier frequency that is offset from a tuned frequency of the receiver.

13. The receiver, as claimed in claim 11, wherein:
said test signal generator includes a baseband signal generator for creating a baseband signal that is used to modulate an RF carrier signal.

14. The receiver, as claimed in claim 13, wherein:
said self-calibration means includes means for determining a receiver output level resulting from said AM test signal.

15. The receiver, as claimed in claim 14, wherein:
said means for determining a receiver output level includes a synchronous detector that receives a signal from said baseband signal generator.

16. The receiver, as claimed in claim 14, wherein:
said self-calibration means includes means for varying a transfer function adjustment value applied to said first signal processor while monitoring said receiver output level to determine a transfer function adjustment value that achieves a lowest output level.

17. The receiver, as claimed in claim 11, wherein:
said self-calibration means includes a calibration switch for switching an input of said receiver between an antenna port and said test signal generator.

18. An apparatus for use in a receiver having a mixer for performing a frequency conversion on a received amplitude modulated interference signal, said mixer having an output port for outputting an intermediate frequency (IF) signal, wherein said IF signal includes first and second differential signals, said apparatus comprising:
a first signal processor for processing said first differential signal according to a first transfer function;
a second signal processor for processing said second differential signal according to a second transfer function, wherein said first transfer function is adjustable with respect to said second transfer function;
a signal combination unit for combining said first differential signal component and said second differential signal component, after processing in said first and second signal processors, in a manner that cancels a common mode signal component;
said signal combination unit includes a difference amplifier to minimize distortion of said first and second transfer functions; and
a buffer amplifier located between said mixer and said signal combination unit, said buffer amplifier including a bipolar junction transistor in a common base configuration.

19. In a receiver having a mixer for performing a frequency conversion on a received signal, a method for improving cancellation of amplitude modulated interference in said received signal, said method comprising:
receiving a signal from a channel;
applying said signal to an input of the mixer, said mixer outputting an IF signal having first and second differential signal components;
first processing said first differential signal component according to a first transfer function;
second processing said second differential signal component according to a second transfer function;
determining at least one operating parameter value for said receiver;
changing said first transfer function based on said at least one operating parameter value;
combining said first differential signal component and said second differential signal component after said steps of first processing and second processing; and
said step of combining includes determining a difference between said first differential signal component and said second differential signal component.

20. The method, as claimed in claim 19, wherein:
said step of changing includes adjusting said first transfer function with respect to said second transfer function.

21. The method, as claimed in claim 19, wherein:
said step of first processing includes amplifying said first differential signal component by a gain factor; and
said step of changing includes adjusting said gain factor.

22. The method, as claimed in claim 19, wherein:
said step of changing includes adjusting an insertion phase of said first transfer function.

23. The method, as claimed in claim 19, wherein:
said step of determining includes finding current values for at least one of the following parameters: local oscillator (LO) frequency, operating temperature, and IF bandwidth.

* * * * *